United States Patent

[11] 3,585,412

[72] Inventors David A. Hodges
Mountainside;
Martin P. Lepselter, New Providence, both of, N.J.
[21] Appl. No. 755,610
[22] Filed Aug. 27, 1968
[45] Patented June 15, 1971
[73] Assignee Bell Telephone Laboratories, Incorporated
Murray Hill, Berkeley Heights, N.J.

[54] SCHOTTKY BARRIER DIODES AS IMPEDANCE ELEMENTS
6 Claims, 7 Drawing Figs.

[52] U.S. Cl. 307/303, 307/291, 317/235 UA, 317/235 D
[51] Int. Cl. H03k 3/26
[50] Field of Search 307/291, 292, 303; 317/235/31

[56] References Cited

UNITED STATES PATENTS

| | | | |
|---|---|---|---|
| 3,102,208 | 8/1963 | Reach | 307/292 |
| 3,463,975 | 8/1969 | Biard | 317/235 |

OTHER REFERENCES

Krakauer & Soshea, "Hot Carrier Diodes Switch in Picoseconds," 7/1963, ELECTRONICS (Mag.), pg. 53— 55.

*Primary Examiner*—Donald D. Forrer
*Assistant Examiner*—R. E. Hart
*Attorneys*—R. J. Guenther and Arthur J. Torsiglieri

ABSTRACT: The reverse characteristic of Schottky barrier diodes provides easily fabricated, small area, high impedance elements for micropower circuits. Advantageously, the diodes are fabricated within semiconductive integrated circuit arrays by forming rhodium silicide on relatively high resistivity P-type silicon. Such diodes are particularly useful in the loads of flip-flops used as cells of a semiconductor memory.

INVENTORS D. A. HODGES
M. P. LEPSELTER
BY David P. Kelley
ATTORNEY

SCHOTTKY BARRIER DIODES AS IMPEDANCE ELEMENTS

BACKGROUND OF THE INVENTION

This invention relates to semiconductive diodes of the Schottky barrier type and, more particularly, to monolithic semiconductive integrated circuits including these devices as elements.

In the design of integrated circuit devices, two prime parametric considerations are generally in conflict. On the one hand, the device should be as physically small as possible, primarily to minimize the cost of the device, but also to maximize the high-speed performance of the device and to minimize the length of electrical connections required. On the other hand, as the device becomes smaller, the power density increases and thermal problems become acute.

One method of reconciling these opposing constraints is to reduce the power dissipated by the integrated circuit as the physical size is reduced. Inasmuch as power is the product of voltage and current, either voltage or current could be reduced to ameliorate the problem. However, electrical noise is primarily a voltage problem, and so the circuit voltages cannot be reduced arbitrarily without encountering noise margin difficulties. To reduce current while maintaining a given voltage requires an increase in impedance levels in the circuit.

As the impedance of a conventional integrated circuit impedance element, e.g., a diffused resistor, increases, its physical size also increases. Alternative impedance elements, e.g., a pinched-off junction field effect transistor, have been used, but it is generally difficult to obtain satisfactory reproducibility in the characteristics of these devices.

Before the advent of integrated circuits, there were proposals for using the reverse characteristics of PN junction diodes to obtain a high impedance in circuits utilizing discrete devices. However, the impedance of high quality PN junction diodes proved to be too high and the lower impedance of intentionally degraded diodes proved to be too difficult to control. Accordingly, the reverse diode approach was not developed further.

SUMMARY OF THE INVENTION

It has been discovered that a Schottky barrier diode comprising an interface between a suitable metal and a zone of relatively high resistivity P-type semiconductivity can be reproducibly fabricated to have a reverse-biased impedance useful for micropower semiconductive integrated circuits.

An advantageous feature of this discovery is that this new form of diode may be fabricated by processing steps entirely compatible with processing used to form the electrode structure of beam lead integrated circuits.

In one embodiment of this invention, the new Schottky barrier diode is formed by reacting a thin layer of rhodium with relatively high resistivity P-type silicon to form the rectifying barrier at the interface between rhodium silicide and silicon. The processing steps are analogous in part to those disclosed for forming a diode between platinum-silicide and N-type silicon in the copending application (E. R. Chenette et al. 1-5-1 ) Ser. No. 683,238, filed Nov. 15, 1967, and assigned to the assignee hereof.

Although our recognition that these new diodes can be advantageously used as physically small, high impedance elements is an advance of general applicability to the micropower circuit art, a particular embodiment employing these diodes as load impedances in a semiconductive memory cell is disclosed in detail as an example hereinbelow.

BRIEF DESCRIPTION OF THE DRAWING

The invention and its further features will be more readily understood from the following detailed description taken in conjunction with the drawing, in which.

DETAILED DESCRIPTION

Figure 1:
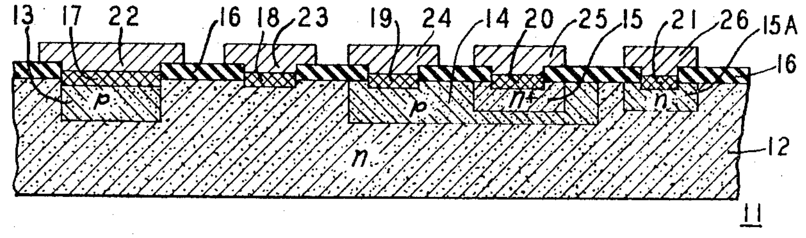
FIG. 1 shows in schematic cross section the various types of metal-semiconductor interfaces which may be formed in the practice of this invention.

The cross-sectional view shown in FIG. 1 is of a portion of a monocrystalline silicon wafer 11 which includes a bulk portion 12 of N-type conductivity adjacent a surface of which two spaced-apart P-type zones 13 and 14 have been formed. Nested within zone 14 is a relatively highly doped N-type zone 15. Another relatively highly doped zone 15A is shown spaced from P-type zone 14. Zones 13, 14, 15, and 15A may be formed by alloying, solid state diffusion, ion implantation, or other processes known to alter the conductivity type of a semiconductive wafer.

After the above-described zones are formed, there is formed a pattern of openings through the passivating silicon oxide 16 to expose portions of the surface of the zones and/or the bulk. Inasmuch as even the more efficient methods of chemical cleaning leave several atomic layers of inorganic films, chemical cleaning methods are generally inadequate for cleaning surfaces on which relatively low energy barrier diodes are to be formed. To ensure a clean silicon surface, therefore, the oxide and exposed silicon surface are advantageously subjected to a backsputtering process such as disclosed in U.S. Pat. No. 3,271,286 to M. P. Lepselter.

Following the cleaning procedure, a thin layer, e.g., 200—500 Angstroms, of rhodium is deposited, e.g., by sputtering or evaporation, over the surface of the oxide and the exposed semiconductor portions. The structure is then heated at a relatively noncritical temperature, e.g., 450°—750° C., for a few minutes to cause the rhodium to react with the silicon. Although the temperature and time are relatively noncritical, a higher temperature, e.g., 700° C., causes a more stable ordering of the resultant crystallites and, therefore, may be desirable. After this step, there is a compound of rhodium and silicon in each of the oxide openings where the rhodium was in contact with the silicon, e.g., regions 17, 18, 19, 20, and 21 in FIG. 1. This compound is termed rhodium silicide.

Inasmuch as rhodium is a relatively inert material, backsputtering is advantageously employed to remove the unreacted rhodium from the surface of the wafer. The technique of backsputtering to remove material from selected portions of a semiconductor workpiece is described in the backsputtering patent to M. P. Lepselter, mentioned hereinabove. The rhodium silicide need not be protected during the backsputtering because the remaining rhodium is removed at about twice the rate of removal of rhodium silicide and because the thickness of the rhodium silicide is significantly greater than the thickness of the rhodium.

To complete the device suitable metal electrodes 22, 23, 24, 25, and 26, and interconnections, if any, are formed, for example, by the titanium-platinum-gold beam lead process disclosed in U.S. Pat. No. 3,335,338 to M. P. Lepselter.

To illustrate the various types of rhodium-silicide-silicon interfaces which may be formed by the above-described process, in FIG. 1 P-type zone 13 has a surface concentration of about $2\times10^{17}$ acceptor impurities per cubic centimeter; N-type bulk 12 has a surface concentration of about $10^{16}$ donor impurities per cubic centimeter; P-type zone 14 has a surface concentration of about $5\times10^{18}$ acceptor impurities per cubic centimeter; and N-type zones 15 and 15A have a surface concentration of about $10^{20}$ donor impurities per cubic centimeter.

Rhodium silicide regions 19, 20, and 21 form Schottky barrier diodes with their respective silicon zones 14, 15, and 15A; but because of the relatively high level of ionized impurities in these zones, a low voltage tunneling mechanism causes these diodes to appear to be virtually ohmic contacts. For this reason, rhodium silicide-silicon interfaces in which the silicon is relatively highly doped will be presumed hereinafter to be ohmic.

Rhodium silicide region 18 reproducibly forms a high quality Schottky barrier diode with bulk N-type region 12 such that the silicide is the anode of the diode and the silicon is the cathode. This diode has a forward voltage of about 0.35 volt at about 100 amperes/cm.$^2$ forward current and a reverse leakage current density of about $10^{16}$ amperes/cm.$^2$ at about 1 volt reverse-bias. This type of diode will be termed an NSB (N-type Schottky barrier) diode hereinbelow.

Rhodium silicide region 17 also reproducibly forms a high quality Schottky barrier diode with P-type zone 13 such that the silicide is the cathode of the diode and the silicon is the anode. This diode has a forward voltage of about 0.02 volt at about 100 amperes/cm.$^2$ forward current density and a reverse leakage current density of about 100 amperes/cm.$^2$ at about 1 volt reverse-bias. This type of diode will be termed a PSB (P-type Schottky barrier) diode hereinbelow.

If, for example, the PSB diode is a dot having an 0.3 mil ($7.62\times10^{14}$ cm.) diameter, the reverse current at 1.0 volt reverse-bias is about 45 microamperes, i.e, the impedance at 1.0 volt reverse-bias is about 22,200 ohms. As will be shown more fully hereinbelow, this magnitude of impedance is useful for micropower semiconductive integrated circuits.

As was mentioned hereinabove, Schottky barrier diodes formed on relatively low resistivity silicon undergo a tunneling mechanism at such low values of reverse-or forward-bias that they appear to be virtually ohmic conduction paths. For this reason, PSB diodes having a useful reverse-bias impedance are advantageously formed on silicon having a surface concentration less than about $5\times10^{17}$ acceptor impurities per cubic centimeter. Although it is possible to form this type of zone by a solid state diffusion of boron impurities through a silicon oxide mask, this process is inherently difficult to reproduce in this range of low surface concentration. Hence, FIGS. 2 and 3 illustrate two alternative methods for forming P-type zones having relatively low surface concentrations.

Figure 2:
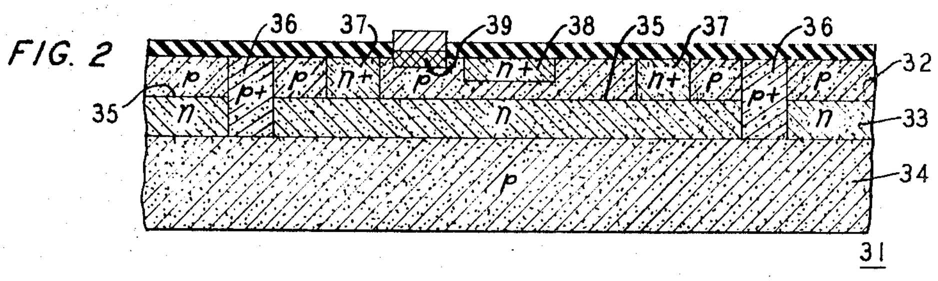
FIG. 2 shows in schematic cross section a portion of an integrated circuit wafer containing Schottky barrier diodes according to this invention, the wafer including two epitaxial layers.

FIG. 2 shows a portion of a silicon integrated circuit wafer 31 having two epitaxial layers 32 and 33 overlying a P-type substrate 34 of about 10 ohm centimeter resistivity. Substantially uniform N-type epitaxial layer 33 was formed to a thickness of about 1.5 microns over an entire major surface of P-type substrate 34; and then substantially uniform P-type epitaxial layer 32 was formed, also to a thickness of about 1.5 microns, over the entire surface of layer 33. Advantageously, layers 32 and 33 have about the same impurity concentration, e.g., $2\times10^{17}$/cm.$^3$, to reduce the movement of their interface, PN junction 35, during subsequent heat treatments. More specifically, N-type layer 33 is about 0.07 ohm centimeter resistivity with a substantially uniform bulk concentration of about $2\times10^{17}$ atoms of antimony per cubic centimeter, and P-type layer 32 is about 0.2 ohm centimeter with a substantially uniform bulk concentration of about $2\times10^{17}$ atoms of boron per cubic centimeter. P-type isolation zones 36, N-type collector contact zones 37, and N-type emitter zone 38 were formed by standard diffusion techniques employing boron as an acceptor impurity and phosphorus as a donor impurity. It will be appreciated that P-type epitaxial layer 32 presents a relatively low surface concentration for the formation of PSB diode 39 thereon. For simplicity, no electrical connections are shown to the other zones in FIG. 2.

Figure 3:
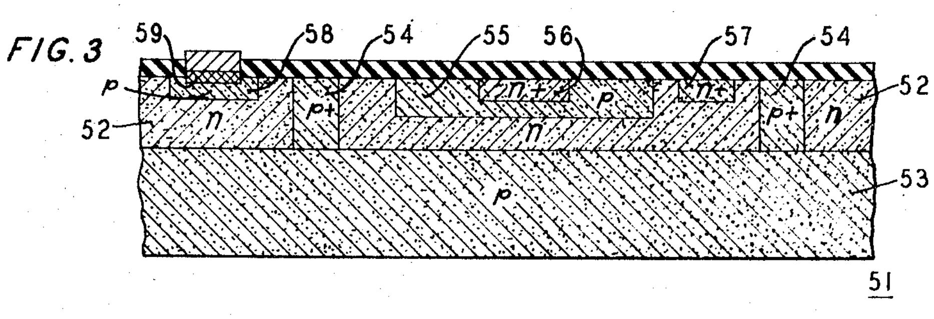
FIG. 3 shows in schematic cross section a portion of an integrated circuit wafer containing Schottky barrier diodes according to this invention, the diodes having been formed with zones produced by ion implantation.

FIG. 3 shows a portion of a silicon integrated circuit wafer 51 having a relatively high resistivity, e.g., 0.3Ω-cm., N-type epitaxial layer 52 overlying a P-type substrate 53. P-type isolation zones 54, P-type base zone 55, N-type emitter zone 56, and N-type collector contact zone 57 were formed by solid state diffusion in the usual fashion. PSB diode 59 was formed on P-type zone 58, a zone formed by ion implantation to a surface concentration of about $2\times10^{17}$ boron atoms per cubic centimeter.

Ion implantation is a technique of bombarding a substrate with a beam of ions to introduce donor or acceptor impurities into the substrate. When the substrate is semiconductive, the impurities can alter the type of semiconductivity. For a general analysis of this technique, see the paper by J. F. Gibbons in Proceedings of the I.E.E.E., Volume 56, No. 3, Mar. 1968, pages 295—319.

In one advantageous method of using ion implantation, a thin metal mask is first formed over the entire surface of a semiconductive substrate. The mask, for example, may be a 10,000 Angstroms thick layer of gold having openings through which portions of the semiconductive surface are exposed. Ionic bombardment of the mask produces localized zones of opposite conductivity type only in those regions of semiconductor material exposed by the openings in the mask.

One potential advantage of doping by ion implantation is the ability to control the doping profiles in three dimensions by modulating the energy, the current, and the position of the ion beam. For example, in FIG. 3 the zone 58 may be formed by ion implantation to have an impurity distribution such that the surface portions of the zone are less heavily doped than the interior portions. For many applications involving PSB diodes, this form of doping profile may be advantageous because there is a low surface concentration in which low barrier Schottky barrier diodes may be formed; and, at the same time, there are relatively highly doped interior portions to minimize series contact resistance in the diode.

Figure 4:
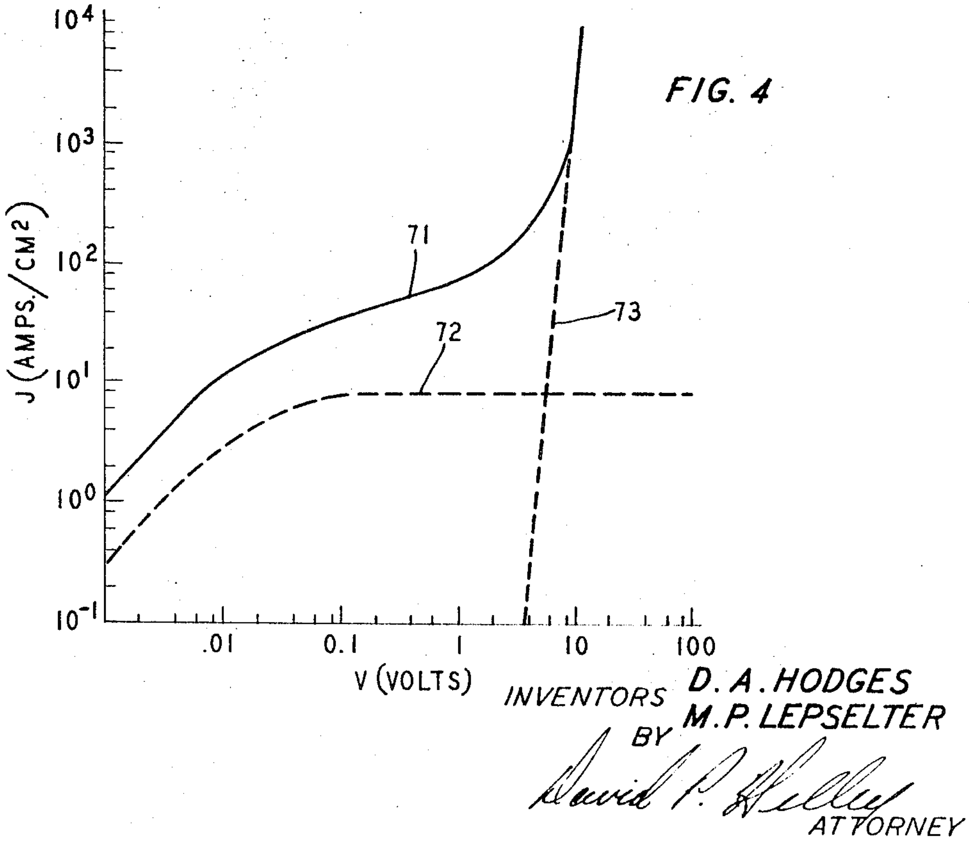
FIG. 4 shows a general reverse current vs. voltage curve characteristic of diodes in accordance with this invention.

With reference now to FIG. 4, there is shown a characteristic curve for a Schottky barrier diode formed between rhodium silicide and P-type silicon. FIG. 4 shows the various reverse current conduction mechanisms which are operative in such a diode. More specifically, solid line 71 shows the actual reverse current as a function of voltage in a diode formed on P-type silicon having a surface concentration of $2\times10^{17}$ boron atoms per square centimeter. Broken line 72 indicates the reverse-bias current to be expected from an ideal junction having a rectifying barrier of a constant height; and, as such, is one component of the total reverse current in the diode. Broken line 73 indicates the amount of current produced by tunneling at given voltage levels and, as such, is another component of the total current in the diode. The curved portion of line 71, between about 0.015 volt and about 7 volts, is indicative of barrier height lowering, a mechanism discussed in the paper by S. M. Sze, C. R. Crowell, and D, Kahng in the Journal of Applied Physics, Volume 35, No. 8, Aug. 1964, pages 2534—2536. As can be seen from curve 71 in FIG. 4; the reverse current of a PSB Schottky barrier diode has an inherent nonlinearity with respect to voltage. This nonlinearity may, of course, be exploited in various digital and linear integrated circuit applications.

Figure 5:
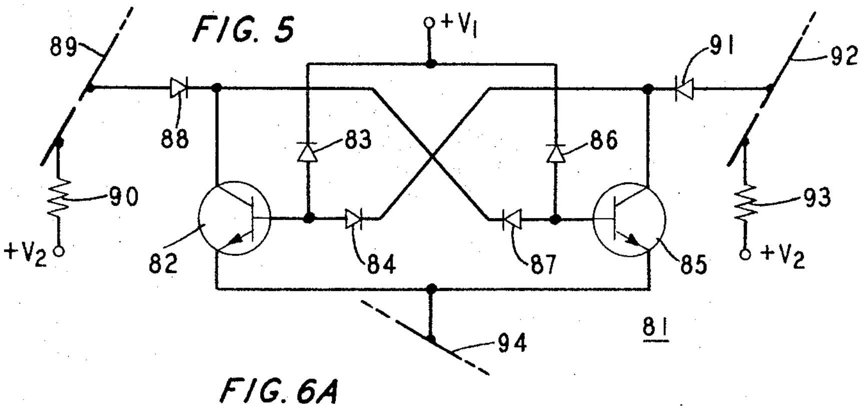
FIG. 5 shows a schematic circuit diagram of a memory cell employing Schottky barrier diodes as load impedances.

FIG. 5 shows a schematic diagram of a circuit especially designed to use the reverse-biased impedance characteristic of the PSB diodes described hereinabove. To this end, the circuit 81 in FIG. 5 is a semiconductive memory cell using PSB diodes as load impedances. The cell is advantageously employed in a diode-coupled, word-organized semiconductive memory, such as described in the copending application Ser. No. 755,590, filed contemporaneously with this application and assigned to the assignee hereof.

Circuit 81 includes two NPN junction transistors 82 and 85 interconnected to form a flip-flop. The base of transistor 82 is connected to the anode of a PSB diode 83 whose cathode is connected to the positive terminal of a source ($+V_1$) of electric power. The base of transistor 82 is also connected to the anode of a second PSB diode 84 whose cathode is connected to the collector of transistor 85. The base of transistor 85 is connected to a third PSB diode 86 whose cathode is connected to positive terminal of voltage source ($+V_1$). The base of transistor 85 is connected to the anode of a fourth PSB diode 87 whose cathode is connected to the collector of transistor 82. The collectors of transistors 82 and 85 are coupled to the semiconductive memory digit lines 89 and 92, respectively, through NSB diodes 88 and 91, respectively, in the manner disclosed in the above-mentioned copending application of Heightley et al. Digit lines 89 and 92 are shown, somewhat symbolically, connected through resistors 90 and 93, respectively, to the positive terminal of a second source ($+V_2$) of electric power. The emitters of transistors 82 and 85 are connected together and to a common work line of the semiconductive memory.

The reverse impedances of PSB diodes 83 and 86 are used as the load impedances for the transistors 82 and 85, respectively. As will be shown more fully hereinbelow, diodes 84 and 87 are included in the circuit only because it is simpler to fabricate the integrated circuit embodiment with the diodes included.

In operation, coupling diodes 88 and 91 are typically reverse-biased during standby periods such that the memory cell is substantially isolated from the digit lines. Circuit voltages, for example, may include a ($+V_1$) of about 2.5 volts and a ($+V_2$) of about 1 volt. At standby, the word line voltage may be about 1.5 volts. Thus, at standby, the total voltage from ($+V_1$) to the emitters of transistors 82 and 85 is about 1 volt. Assume, for example, transistor 82 is "on." Then, the collector current for transistor 82 flows from power supply ($+V_1$) through diode 86 in the reverse direction and through diode 87 in the forward direction. To minimize their effect in the circuit, diodes 84 and 87 are designed advantageously to have at least twice the area of diodes 83 and 86. When transistor 82 is "on," its collector-emitter voltage is about 0.2 volt; the forward voltage drop across diode 87 is about 0.02 volt; which leaves about 0.78 volt over diode 86 in the reverse direction. Inasmuch as the emitter base voltage of transistor 82 will be about 0.55 volt, there is only about 0.45 volt over diode 83 in the reverse direction. With diodes 83 and 86 the same size and designed, for example, to carry about 40 microamperes in the reverse direction at 0.7 volt and about 30 microamperes at 0.45 volt, the standby power dissipated in the cell is about 70 microwatts.

As described in the contemporaneously filed application of Heightley et al., noted hereinabove, to write into the cell the voltage on word line 94 is reduced to about ground voltage and an additional current from outside the cell is supplied through one of the coupling diodes 88 or 91. When, for example, transistor 82 is "on," and it is desired to turn transistor 85 "on," an additional current, e.g., a few milliamperes, is supplied through diode 88. This current initially flows into the collector of transistor 82 which is designed to have a relatively high collector series resistance, e.g., 300 ohms. The voltage across the collector series resistance is such that the emitter-base junction of transistor 85 becomes forward-biased and transistor 85 turns "on." As transistor 85 turns "on" its collector voltage decreases and transistor 82 turns "off." Analogously, if it is desired to turn "on" transistor 82, an excess current is supplied to diode 91 from digit line 92.

As in the above-described write operation, to read the status of cell 81 the word line voltage is again reduced to near ground. That coupling diode, either 88 or 91, connected to the transistor which is "on" will conduct a dynamic current from the digit line into the cell. Inasmuch as this dynamic current results primarily from the discharging of parasitic capacitance associated with the digit line, the voltage on the digit line changes. Using a balanced detector, the polarity of the voltage between the digit lines is then sensed to determine the status of the cell.

Figure 6A:
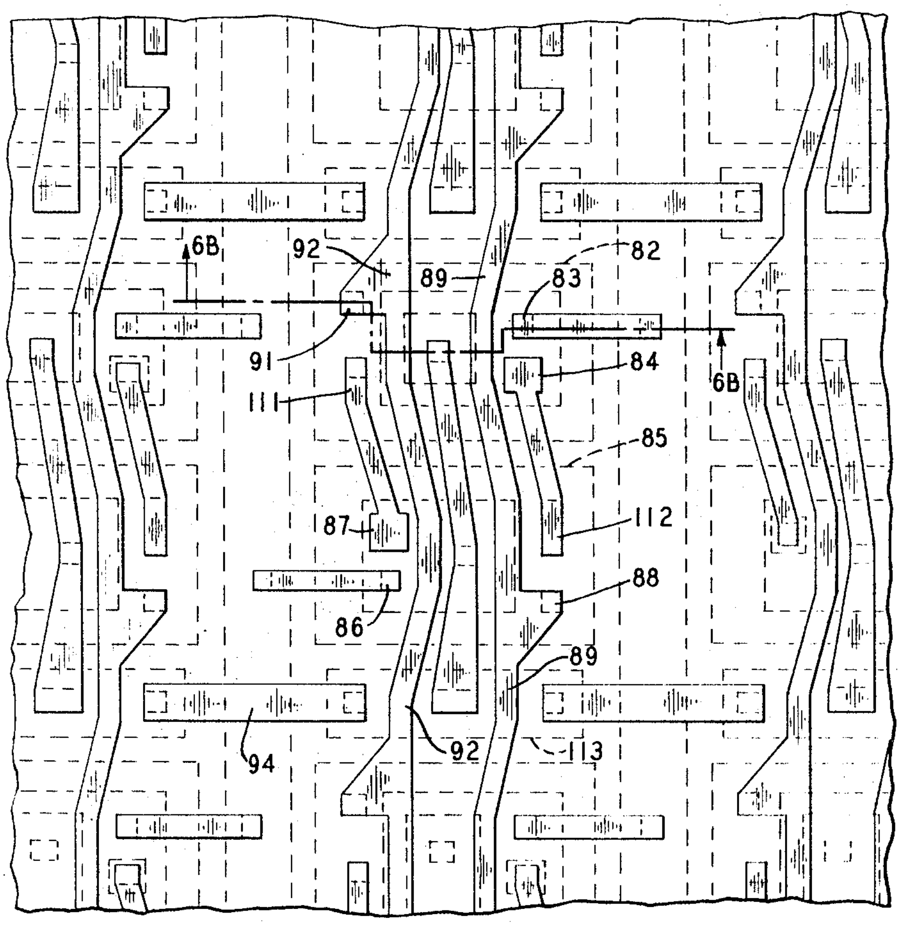
FIG. 6A shows a plan view of one possible semiconductive integrated circuit layout of the circuit of FIG. 5.
Figure 6B:
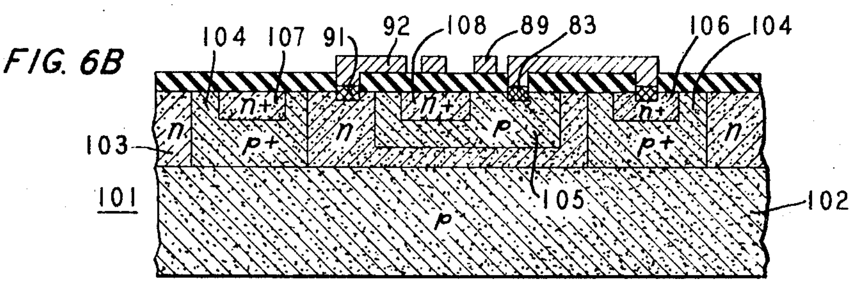
FIG. 6B shows a schematic cross section of the integrated circuit of FIG. 6A.

FIG. 6A shows a schematic plan view of one possible integrated circuit embodiment of an array of the memory cells depicted in FIG. 5; and FIG. 6B shows a schematic cross section of FIG. 6A. Corresponding elements in FIGS. 5, 6A, and 6B are denoted by the same reference numerals.

In the manner known for fabrication of monolithic integrated circuits, an array of identical memory cells is formed in a monocrystalline silicon slice 101. The slice comprises original substrate material 102 of P-type conductivity and a relatively thin N-type epitaxial layer 103 grown thereover. Layer 103, for example, may be typically 0.3 ohm centimeter resistivity and about 4 microns thick. A localized deep diffusion of boron impurities forms the relatively low resistivity P-type isolation zones 104. Another localized diffusion of boron impurities forms base zone 105 with a surface concentration of about $10^{17}$ atoms per square centimeter. A localized diffusion of phosphorus forms the relatively low resistivity N-type zones 106, 107, and 108. Then, in the manner described with reference to FIG. 1 hereinabove, a relatively thin layer of rhodium is sintered to the semiconductor surface exposed through oxide mask openings to form the virtual ohmic connections to the low resistivity semiconductor zones and Schottky barrier diodes to the relatively high resistivity zones.

It will be apparent that a variety of arrangements may be adopted for accomplishing actual electrical contact to the semiconductor zones and for accomplishing the interconnection of integrated arrays of functional elements to form the integrated circuit cell. A particularly advantageous technique includes the use of a beam lead technology such as disclosed in the M. P. Lepselter U.S. Pat. No. 3,335,338.

More specifically now, FIGS. 6A and 6B show flip-flop transistor 82 including a relatively high resistivity base zone 105 and a low resistivity emitter zone 108 nested therewithin. Rhodium silicide-silicon PSB diodes 83 and 84 are formed in base zone 105. As was mentioned hereinabove, diode 84 is included only because a separate diffusion would be required to eliminate it. More specifically, though it would be desirable to have an ohmic connection to the base, a highly doped P-type zone would have to be formed to prevent the formation of a diode. To minimize the circuit importance of diode 84, it is made larger than diode 83 so that diode 84 has a larger reverse current and a smaller forward voltage. The same considerations apply to diode 87 in relation to diode 86.

Connections 111 and 112 from diodes 87 and 84 to the N-type collectors of transistors 82 and 85, respectively, also should be ohmic. Fortunately, the interface between rhodium silicide and the highly doped emitter zones is virtually ohmic. Thus, during the emitter diffusion, highly doped N-type zones were formed in epitaxial layer 103 to provide virtually ohmic connections 111 and 112. Coupling diodes 88 and 91 are NSB diodes formed as described with reference to FIG. 1 hereinabove.

Highly doped N-type zones 106 and 107, formed in P-type isolation zone 104, are used for the conduction path between the positive terminal of the power source ($+V_1$) and each cell. To this end, PSB diodes 83 and 86 are shown connected to the N-type zones 106 and 107, respectively. It will be seen that word line 94 crosses under digit lines 89 and 92 via a highly doped N-type zone 113 in the manner described in U.S. Pat. No. 3,295,031, issued Dec. 27, 1966.

It should be apparent that the specific embodiments described are merely illustrative of the general principles of the invention. Various modifications may be devised consistent with the spirit and scope of the invention. For example, different metals such as platinum, zirconium, and palladium, and alloys of metals may be substituted for rhodium to provide high quality Schottky barrier diodes having rectifying barrier heights different from the rhodium silicide-silicon diodes described in detail hereinabove.

Further, it should be evident that the use of PSB diodes as relatively high impedance circuit elements is an advance of general applicability to the micropower circuit art; and, as such, is not limited to the digital embodiment described herein.

Still further, it should be evident that NSB diodes can be used as high impedance elements in circuits having higher impedance levels than those conveniently available in PSB diodes.

Still further, it should be evident that PSB diodes and/or NSB diodes can be used as high impedance elements in circuits having field effect transistors.

We claim:

1. A semiconductor circuit comprising:

a transistor;

a voltage source; and a P-type Schottky barrier diode connected between the transistor and the voltage source for providing an impedance element therebetween, the P-type Schottky barrier diode comprising a metal silicide contiguous with and in rectifying contact with P-type silicon, the P-type Schottky barrier diode being disposed in polarity with respect to the transistor and the voltage source such that the diode is reverse-biased and the current flowing into one of the terminals of the transistor is the reverse current of the diode when the transistor is operating in the active mode or the saturated mode, and the P-type Schottky barrier diode and the transistor being disposed in a single piece of silicon as a part of a monolithic integrated circuit.

2. Apparatus as recited in claim 1 wherein the reverse impedance of the P-type Schottky barrier diode at 1 volt reverse-bias is about 20,000 ohms.

3. Apparatus as recited in claim 1 wherein the reverse leakage current of the P-type Schottky barrier diode at a reverse voltage less than about 10 volts is between one ampere/$cm.^2$ and 1,000 amperes/$cm^2$.

4. Apparatus as recited in claim 1 wherein the reverse leakage current of the P-type Schottky barrier diode at 1 volt reverse-bias is within an order of magnitude of 100 amperes/$cm^2$.

5. Apparatus as recited in claim 1 wherein the P-type silicon portion of the P-type Schottky barrier diode is doped to a surface concentration of less than about $5\times10^{17}/cm^3$.

6. Apparatus as recited in claim 1 wherein the metal silicide portion of the P-type Schottky barrier diode is selected from the group consisting of rhodium silicide, platinum silicide, palladium silicide, and zirconium silicide.